United States Patent
Arai et al.

(10) Patent No.: US 8,866,651 B2
(45) Date of Patent: Oct. 21, 2014

(54) ANALOG-TO-DIGITAL CONVERTER AND SELF-DIAGNOSIS METHOD FOR ANALOG-TO-DIGITAL CONVERTER

(71) Applicant: Renesas Electronics Corporation, Kawasaki (JP)

(72) Inventors: Kazuyuki Arai, Yokohoma (JP); Isao Sezaki, Yokohoma (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/067,806

(22) Filed: Oct. 30, 2013

(65) Prior Publication Data

US 2014/0118174 A1     May 1, 2014

(30) Foreign Application Priority Data

Oct. 31, 2012    (JP) ................................ 2012-240133

(51) Int. Cl.
     *H03M 1/10*         (2006.01)
     *H03M 1/46*         (2006.01)

(52) U.S. Cl.
     CPC .............. *H03M 1/1076* (2013.01); *H03M 1/46* (2013.01)
     USPC ........... 341/120; 341/118; 341/121; 341/155; 341/172

(58) Field of Classification Search
     CPC ..... H03M 1/804; H03M 1/46; H03M 1/1038; H03M 1/069; H03M 1/1019; H03M 1/1023; H03M 1/12; H03M 1/1061; H03M 1/0607; H03M 1/1033; H03M 1/1071; H03M 1/466; H03M 1/0678; H03M 1/00; H03M 1/109

USPC .................. 341/118–121, 155, 164, 165, 172
See application file for complete search history.

(56) References Cited

U.S. PATENT DOCUMENTS

| | | | | |
|---|---|---|---|---|
| 4,679,028 | A * | 7/1987 | Wilson et al. | 341/120 |
| 5,644,308 | A * | 7/1997 | Kerth et al. | 341/120 |
| 6,268,813 | B1 * | 7/2001 | de Wit | 341/120 |
| 7,265,694 | B2 * | 9/2007 | Guidry | 341/120 |
| 7,408,490 | B2 * | 8/2008 | Melanson et al. | 341/120 |
| 7,880,650 | B2 * | 2/2011 | Feddeler et al. | 341/120 |
| 7,973,684 | B2 * | 7/2011 | Nolan et al. | 341/118 |
| 8,111,178 | B2 * | 2/2012 | Liao et al. | 341/120 |
| 8,378,863 | B2 * | 2/2013 | Ishikawa | 341/118 |
| 8,477,052 | B2 * | 7/2013 | Dey et al. | 341/120 |

FOREIGN PATENT DOCUMENTS

JP      2009-71459 A      4/2009

* cited by examiner

*Primary Examiner* — Linh Nguyen
(74) *Attorney, Agent, or Firm* — McGinn IP Law Group, PLLC

(57) ABSTRACT

An analog-to-digital converter includes an input terminal to which an analog input voltage is input, a digital-to-analog converter unit, a comparator that compares the analog input voltage and an output voltage of the digital-to-analog converter unit with each other, a successive approximation register that stores a conversion result output from the comparator, a generator unit that generates added digital data and subtracted digital data, the added digital data and the subtracted digital data being obtained by adding and subtracting the conversion result to and from the conversion result retained by the successive approximation register, respectively, and a determination unit that determines whether or not a failure is occurring, by using a result of the comparison between the analog input voltage and output levels obtained by the digital-to-analog converter unit converting the added digital data and the subtracted digital data.

14 Claims, 9 Drawing Sheets

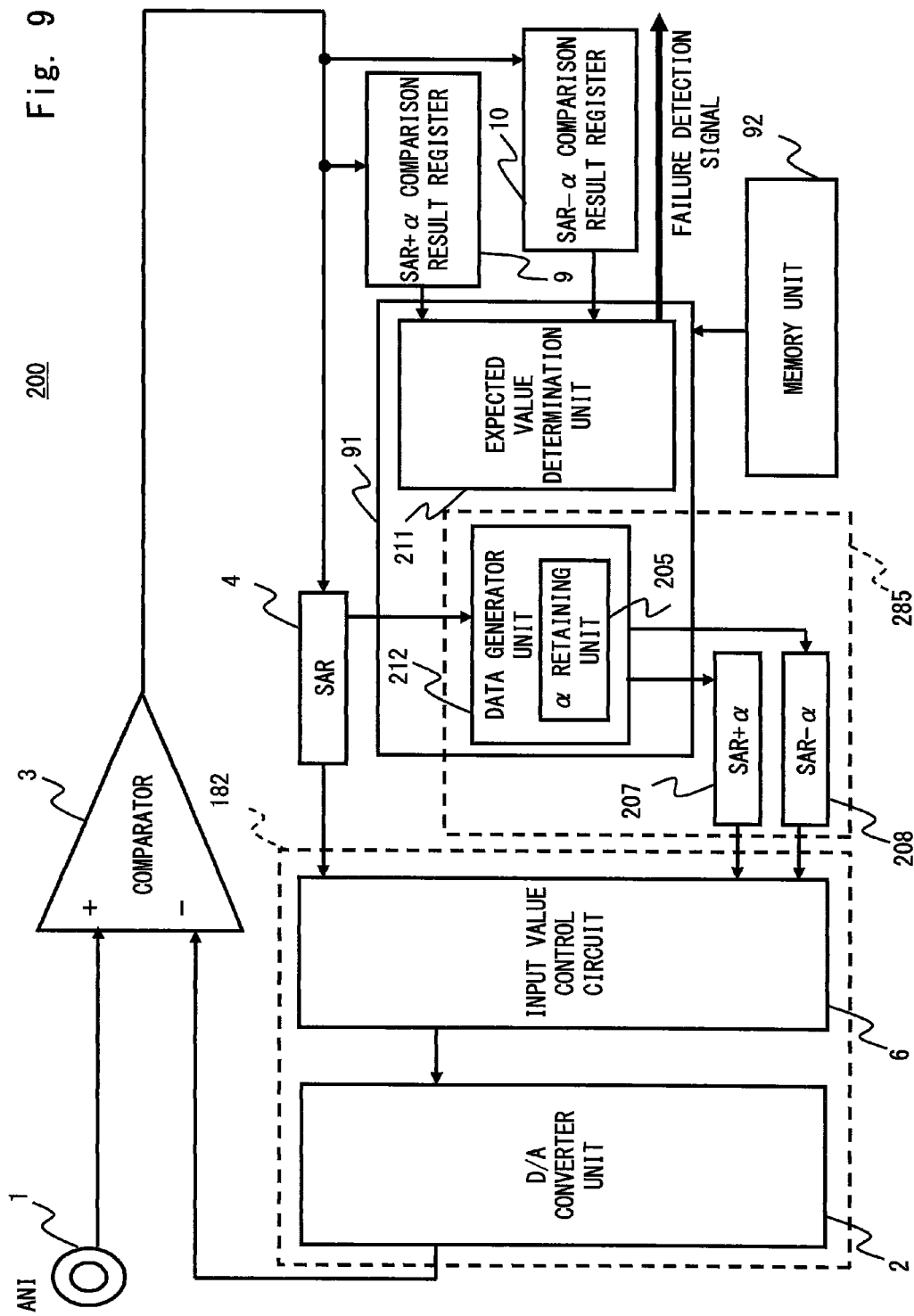

ANALOG-TO-DIGITAL CONVERTER AND SELF-DIAGNOSIS METHOD FOR ANALOG-TO-DIGITAL CONVERTER

CROSS-REFERENCE TO RELATED APPLICATIONS

This application is based upon and claims the benefit of priority from Japanese patent application No. 2012-240133, filed on Oct. 31, 2012, the disclosure of which is incorporated herein in its entirety by reference.

BACKGROUND

The present invention relates to an A/D converter (analog-to-digital converter), and to a self-diagnosis technique for an A/D converter installed in a Micro Controller Unit (hereinafter referred to as the MCU) that requires high safety for exerting vehicle control, for example.

Recent automobiles have various functions, and have an in-vehicle system installed for realizing those functions. On the other hand, since an occurrence of a failure in an automobile is life-threatening, the in-vehicle system is strongly required to be highly reliable.

Such an in-vehicle system is equipped with many analog output sensors, and system control is exerted using the output values of the sensors. For example, in connection with an airbag, an analog output sensor converts acceleration or pressure into an analog signal, and inputs the analog signal to the MCU. The MCU periodically performs AD (analog-to-digital) conversion to the received analog signal, and determines whether or not a car collision has occurred based on the AD conversion result.

As in the example of the airbag described above, the analog voltage output from the analog output sensor is generally acquired as digital data through use of the A/D converter installed in the MCU. Therefore, since a failure of the A/D converter in the in-vehicle system may possibly invite a fatal error in the system, it is demanded to surely carry out failure detection as to the A/D converter.

As to the A/D converter, the successive approximation A/D converter is widely used. The successive approximation A/D converter includes a D/A converter, and performs conversion by comparing an analog input signal and a feedback signal of the D/A converter with each other by 1 bit. That is, when the D/A converter is suffering from a failure, the A/D converter does not output a correct AD conversion result, and hence the system as a whole cannot operate correctly.

Japanese Unexamined Patent Application Publication No. 2009-71459 (hereinafter referred to as "Takamatu et al.") discloses a technique for detecting a failure of a D/A converter. According to the technique of Takamatu et al., firstly, digital data corresponding to a desired analog voltage to be output from the D/A converter is input to the D/A converter being the self-diagnosis target, and an analog voltage output from the D/A converter is subjected to AD conversion by the A/D converter installed in the MCU. Then, the acquired digital data is compared against the digital data having been input to the D/A converter being the self-diagnosis target, and whether or not the difference is appropriate is checked.

With the technique of Takamatu et al., the D/A converter built in the A/D converter is used for diagnosing a failure. In this case, when the A/D converter is performing normal AD conversion, a failure diagnosis cannot be performed using the D/A converter. In addition, in the case where a failure diagnosis is performed using the D/A converter when the A/D converter is performing normal AD conversion, in addition to the A/D converter, a separate failure diagnosis-dedicated A/D converter becomes necessary. This increases the circuit scale.

SUMMARY

The inventors of the present invention have found a technique for improving the precision of a failure diagnosis of the A/D converter without inviting an increase in the circuit scale.

Other problems to be solved and novel features will become apparent from the description of the present specification and accompanying drawings.

According to one exemplary embodiment, with an analog-to-digital converter and a self-diagnosis method for an analog-to-digital converter, an analog input voltage is converted into digital data. Added digital data and subtracted digital data are generated, by adding and subtracting a prescribed value to and from the converted digital data, respectively. Then, using a result of comparison between output levels being the analog data converted by the digital-to-analog converter and the analog input voltage, whether or not a failure is occurring is determined.

According to one exemplary embodiment, without inviting an increase in the circuit scale, the precision of a failure diagnosis of an A/D converter can be improved.

BRIEF DESCRIPTION OF THE DRAWINGS

The above and other aspects, advantages and features will be more apparent from the following description of certain embodiments taken in conjunction with the accompanying drawings, in which:

FIG. 9 is a block diagram showing an exemplary structure of the self-diagnosis system of the A/D converter according to the second exemplary embodiment.

DETAILED DESCRIPTION

Figure 1:
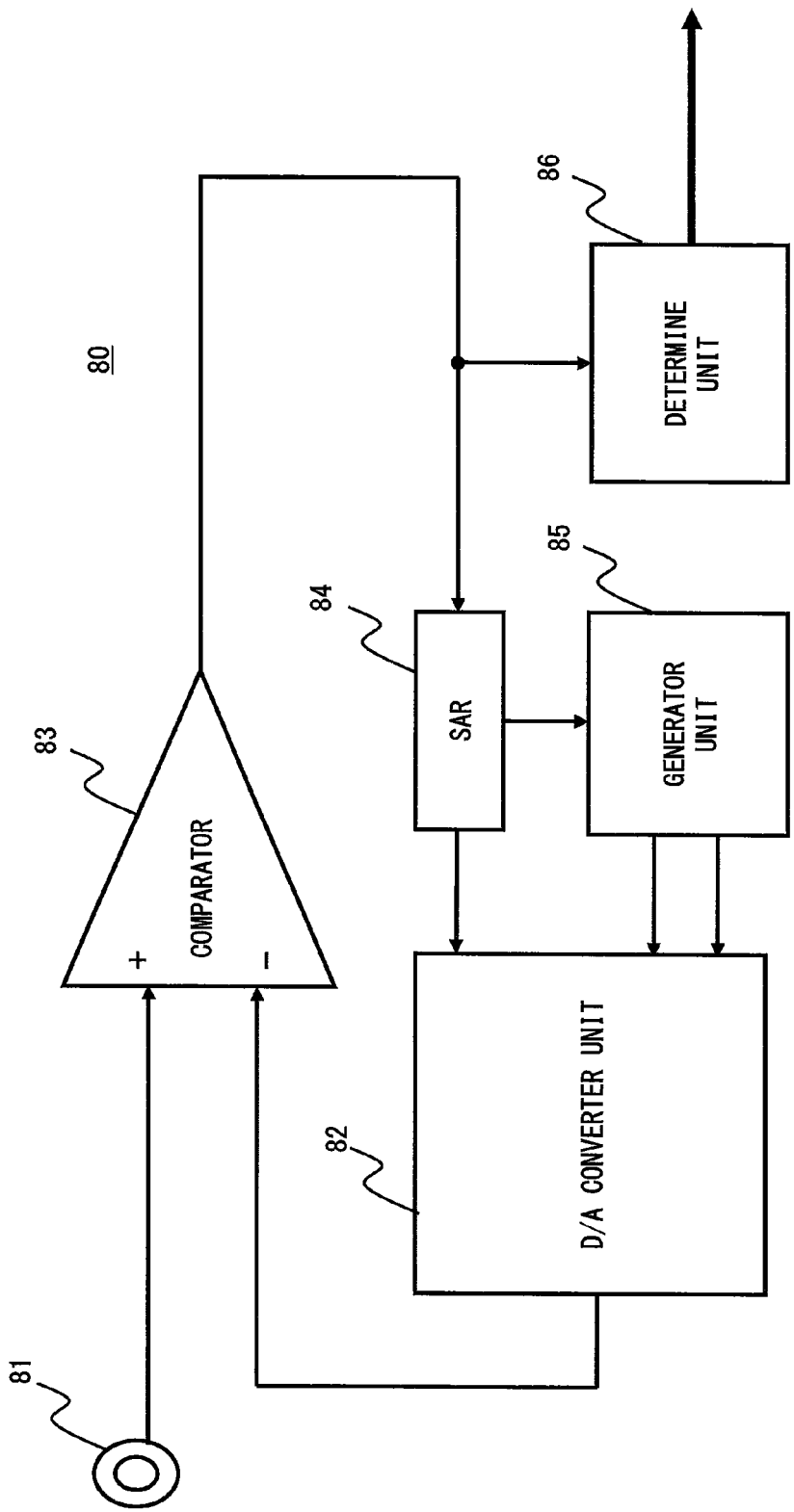
FIG. 1 is a block diagram showing an exemplary structure of an A/D converter according to one exemplary embodiment.

In the following, a description will be given of exemplary embodiments with reference to the drawings. In order to clarify the description, the following description and accompanying drawings avoid repetitive description and are simplified as appropriate. In the drawings, the constituent elements having an identical structure or function or corresponding parts are denoted by an identical reference characters, and the description thereof will not be repeated.

Overview of the Invention

An A/D converter according to an exemplary embodiment is a successive approximation A/D converter that includes a comparator comparing an analog input voltage and an output voltage of a D/A converter with each other. The A/D converter stores the conversion result output from the comparator in a successive approximation register, and generates digital data by adding or subtracting a prescribed value (digital data α, the value of the digital data a being a numerical value of zero or more) to or from the conversion result. At the comparator, a failure diagnosis is performed based on the result of comparison between the analog input voltage and the output level of the D/A converter corresponding to the digital data to or from which the digital data α is added or subtracted. The digital data α is the value that is preset and retained. FIG. 1 shows an exemplary structure of an A/D converter 80 according to one exemplary embodiment.

The A/D converter 80 includes an input terminal 81 to which an analog input voltage is input, a digital-to-analog converter unit (D/A converter unit) 82, a comparator 83, a successive approximation register (SAR) 84, a generator unit 85, and a determination unit 86.

The comparator 83 compares an analog input voltage and an output voltage of the D/A converter unit with each other.

The successive approximation register 84 stores the conversion result output from the comparator 83. The successive approximation register 84 is structured to output the conversion result to the D/A converter unit 82 and the generator unit 85.

The generator unit 85 generates added digital data by adding the digital data α to the conversion result retained by the successive approximation register 84, and subtracted digital data by subtracting the digital data α from the conversion result.

The determination unit 86 compares the analog input voltage and the output levels obtained by the D/A converter unit 82 converting the added digital data and the subtracted digital data with each other, and determines whether or not a failure is occurring using the comparison result. Specifically, the determination unit 86 makes the determination using: a first comparison result obtained by a comparison between the analog input voltage and a first output level obtained by the D/A converter unit 82 by converting the added digital data; and a second comparison result obtained by a comparison between the analog input voltage and a second output level obtained by the D/A converter unit 82 by converting the subtracted digital data.

The A/D converter 80 is structured such that the first and second comparison results are obtained at the determination unit 86. Specifically, firstly, the A/D converter 80 outputs the added digital data and the subtracted digital data generated by the generator unit 85 to the D/A converter unit 82. Next, the D/A converter unit 82 outputs the first output level and the second output level respectively being the converted added digital data and the converted subtracted digital data to the comparator 83 at a prescribed timing. Further, the A/D converter 80 is structured such that the comparator 83 outputs the first comparison result obtained by a comparison between the analog input voltage and the first output level and the second comparison result obtained by a comparison between the analog input voltage and the second output level to the determination unit 86. The determination unit 86 is structured to determine whether or not there is a failure when the first comparison result and the second comparison result are output from the comparator 83, and to output the result.

With the failure diagnosis according to one exemplary embodiment, it is determined that the A/D converter 80 is normal when the comparison result of the comparator 83 shows that the conversion result to which the digital data α is added is greater than the analog input voltage and the conversion result from which the digital data α is subtracted is smaller than the analog input voltage. Specifically, the determination unit 86 determines that there is no failure when the analog input voltage is lower than the first output level being the converted added digital data, and greater than the second output level being the converted subtracted digital data. On the other hand, the determination unit 86 determines that there is a failure in other conditions, i.e., when the analog input voltage is equal to or greater than the first output level or when the analog input voltage is equal to or smaller than the second output level.

Thanks to the failure diagnosis being realized by the structure described above, the A/D converter 80 itself can constantly perform a failure diagnosis every time AD conversion is performed.

Note that, in FIG. 1, the A/D converter 80 may be structured such that the generator unit 85 retains the digital data α. Alternatively, the A/D converter 80 may include a register that retains the digital data α. In addition, the A/D converter 80 can be structured such that the digital data α can be changed externally.

Further, the digital data α is the value variably set by the user. The digital data α must be set based on the overall error of the A/D converter 80. The overall error of the A/D converter 80 is the value that changes depending on the usage environment of the user. The factors that influence the usage environment of the user include the number of bits of AD conversion (for example, 12-bit conversion mode/10-bit conversion mode), the voltage supplied to the A/D converter 80 (AD reference voltage: AnVREF), whether or not the optional function (a channel sample and hold function) of AD conversion is used and the like.

The overview of the A/D converter 80 according to the one exemplary embodiment has been described with reference to FIG. 1. In each of the following exemplary embodiments, a description will be given of an exemplary structure that includes a specific circuit structure of the A/D converter 80 and the like.

First Exemplary Embodiment

Structure of First Exemplary Embodiment

Figure 2:
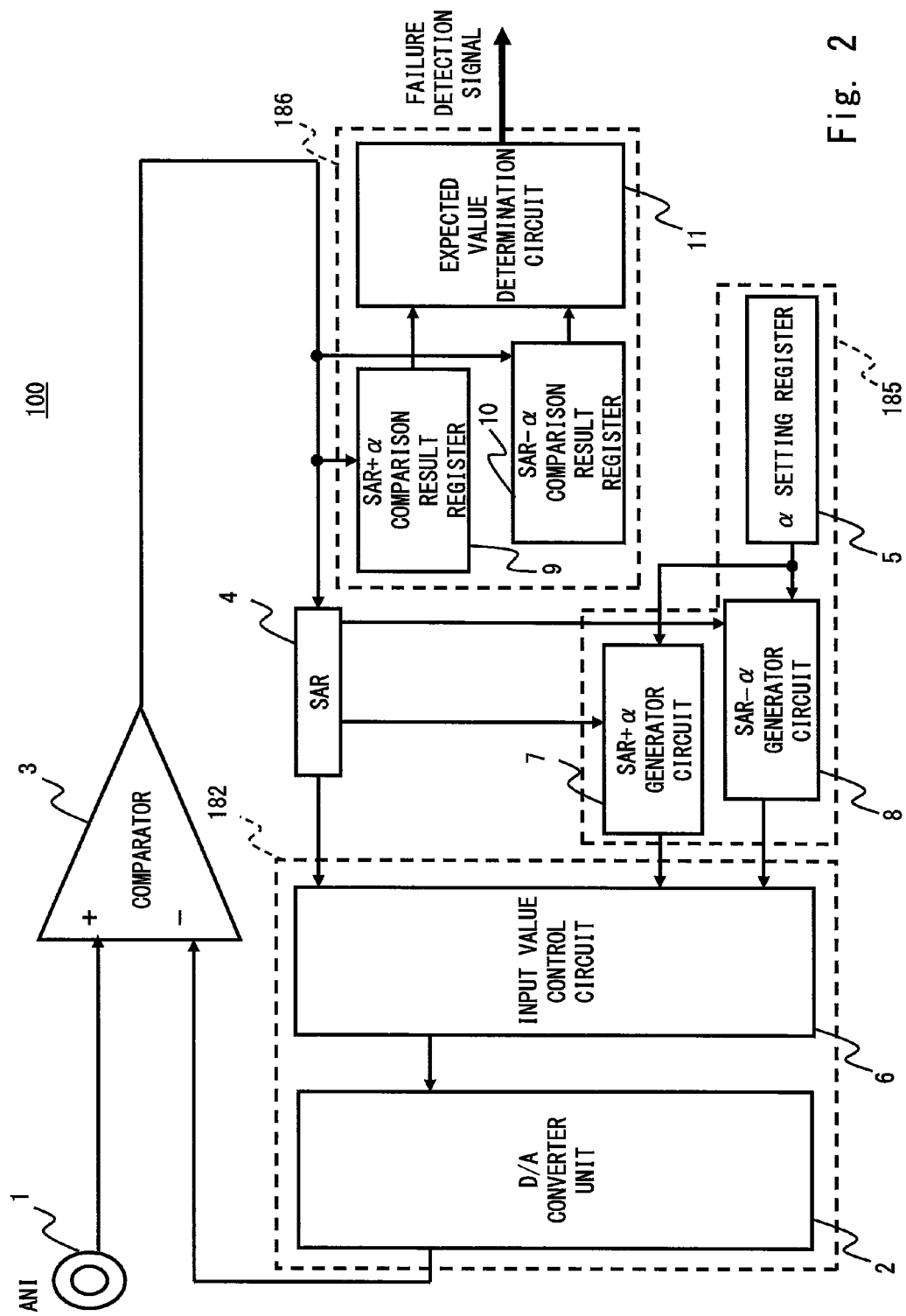
FIG. 2 is a block diagram showing an exemplary structure of a successive approximation A/D converter according to a first exemplary embodiment.

FIG. 2 is a block diagram showing an exemplary structure of a successive approximation A/D converter according to a first exemplary embodiment.

The A/D converter 100 includes an analog input terminal (hereinafter referred to as the "ANI" as appropriate) 1, a D/A converter 2, a comparator 3, an SAR register (SAR) 4, an α setting register 5, an input value control circuit (D/A converter input value control circuit) 6, an SAR+α generator circuit 7, an SAR−α generator circuit 8, an SAR+α comparison result register 9, an SAR−α comparison result register 10, and an expected value determine circuit 11.

The comparator 3 compares a voltage input to the analog input terminal 1 and an analog voltage output from the D/A converter 2 with each other.

The SAR register 4 stores the result obtained by the successive approximation scheme.

The α setting register 5 retains digital data α to be added to or subtracted from the data stored in the SAR register 4.

The input value control circuit 6 selects the digital data output to the D/A converter 2.

The SAR+α generator circuit 7 outputs digital data SAR+α (added digital data), which is obtained by adding the digital data α to the data stored in the SAR register 4, to the input value control circuit 6.

The SAR−α generator circuit 8 outputs digital data SAR−α (subtracted digital data), which is obtained by subtracting the digital data α from the data stored in the SAR register 4, to the input value control circuit 6.

The SAR+α comparison result register 9 stores the result of comparison (an SAR+α comparison result, a first comparison result) made by the comparator 3 between a voltage input to the ANI 1 and an analog voltage obtained by the D/A converter 2 by performing DA conversion to the digital data SAR+α.

The SAR−α comparison result register 10 stores the result of comparison (an SAR−α comparison result, a second comparison result) made by the comparator 3 between a voltage input to the ANI 1 and an analog voltage obtained by the D/A converter 2 by performing DA conversion to the digital data SAR−α.

The expected value determine circuit 11 determines whether or not the SAR+α comparison result and the SAR−α comparison result are each an expected value. The expected value is defined as follows: for the SAR+α comparison result, "the voltage being input to the ANI 1 is smaller than the analog voltage obtained by the D/A converter 2 performing DA conversion to the digital data SAR+α"; for the SAR−α comparison result, "the voltage being input to the ANI 1 is greater than the analog voltage obtained by the D/A converter 2 performing DA conversion to the digital data SAR−α".

The digital data α is set as an error tolerable for the user, and is a value being equal to or greater than the overall error being the characteristic of the A/D converter. For example, when the overall error of the A/D converter 100 is ±1 LSB, α=2 is set.

Further, the A/D converter 100 is associated with the constituent elements of the A/D converter 80 shown in FIG. 1 as follows. The D/A converter 2 and the input value control circuit 6 structure a D/A converter unit 182, which corresponds to the D/A converter unit 82. The α setting register 5, the SAR+α generator circuit 7, and the SAR−α generator circuit 8 structure a generator unit 185, which corresponds to the generator unit 85. The SAR+α comparison result register 9, the SAR−α comparison result register 10, and the expected value determine circuit 11 structure a determination unit 186, which corresponds to the determination unit 86.

The SAR+α generator circuit 7 is referred to also as an α addition generator circuit, or a first generator circuit. The SAR−α generator circuit 8 is referred to also as an α subtraction generator circuit, or a second generator circuit. The SAR+α comparison result register 9 is referred to also as an SAR+α comparison result storage register, an α addition comparison result register, or a first comparison result register. The SAR−α comparison result register 10 is referred to also as an SAR−α comparison result storage register, an α subtraction comparison result register, or a second comparison result register.

Figure 3:
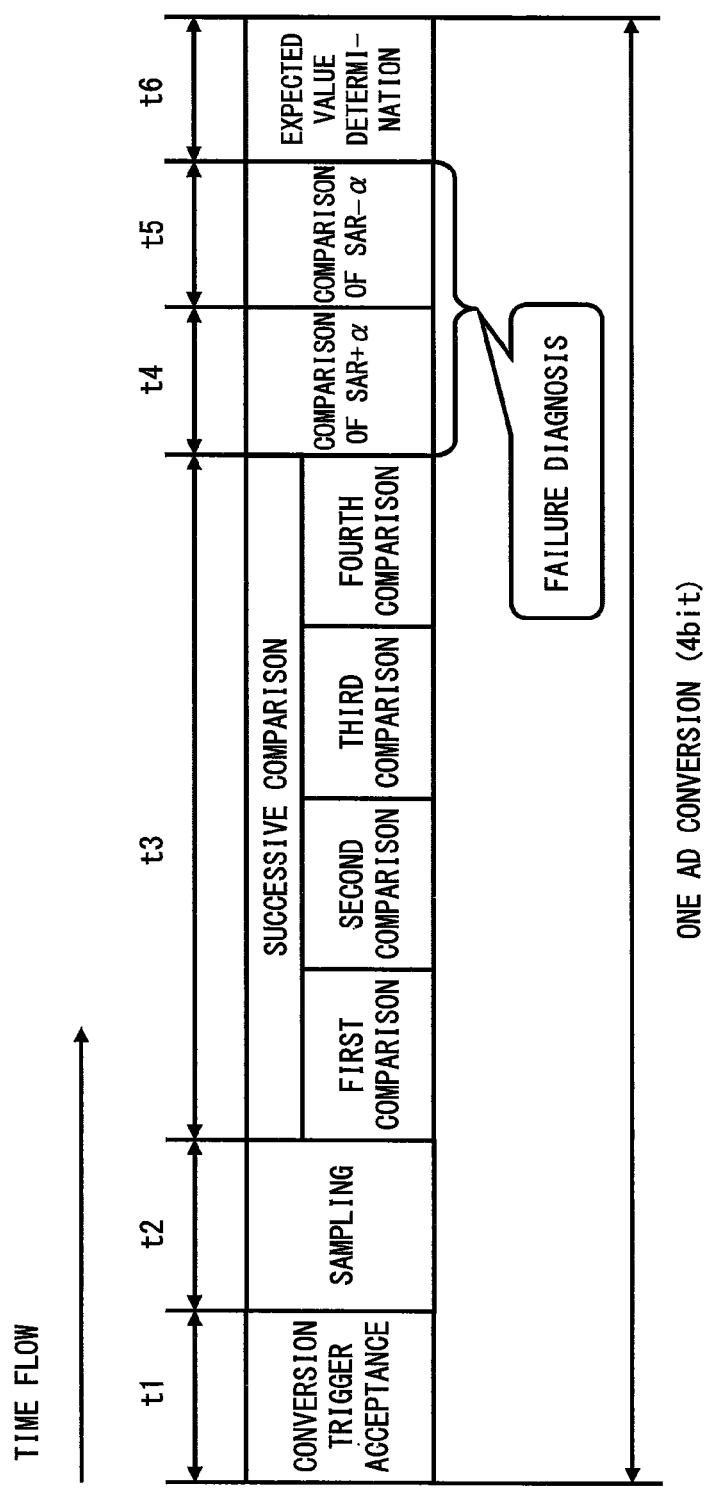
FIG. 3 is a timing chart showing an exemplary operation of the A/D converter 100 according to the present exemplary embodiment shown in FIG. 2.

Operation, Manufacturing Method and the Like According to First Exemplary Embodiment FIG. 3 is a timing chart showing an exemplary operation of the A/D converter 100 according to the present exemplary embodiment shown in FIG. 2. FIG. 3 shows the exemplary operation in which the A/D converter 100 performs AD conversion to the sampling voltage per analog input, and performs a failure diagnosis for the conversion result. Further, the following description is based on the premise that the A/D converter 100 is of a 4-bit successive approximation type. Still further, the digital data value for the α setting register 5 is set as α=1 in order to simplify the description. Firstly, while referring to FIG. 2, a description will be given of the basic operation of the A/D converter 100 with reference to FIG. 3.

Period t1:

The A/D converter 100 accepts an AD conversion trigger. Here, the AD conversion trigger refers to a periodical AD conversion request signal from, for example, an interval timer built in the MCU.

Period t2:

In order to perform AD conversion of the successive approximation type, the A/D converter 100 performs sampling of an analog voltage input from the ANI 1.

Period t3:

In the A/D converter 100, firstly, the D/A converter 2 performs DA conversion to the output data output from the input value control circuit 6. Next, the comparator 3 compares an analog voltage output from the D/A converter 2 and an analog voltage applied to the ANI 1 sampled in period t2 to each other. At this time, since the A/D converter 100 is of the 4-bit successive approximation type, this operation is repeated four times, i.e., from the first comparison to the fourth comparison (the 4-bit successive approximation type AD conversion).

The A/D converter 100 stores the data of the AD conversion result acquired by this AD conversion in the SAR register 4.

Period t4:

The A/D converter 100 inputs the digital data SAR+α, which is produced by the SAR+α generator circuit 7 by adding the digital data α set at the α setting register 5 to the data stored in the SAR register 4, to the input value control circuit 6. Then, the comparator 3 compares the analog voltage output from the D/A converter 2 and the voltage applied to the ANI 1 with each other, and stores the result in the SAR+α comparison result register 9.

Period t5:

In the A/D converter 100, the SAR−α generator circuit 8 generates digital data SAR−α by subtracting the digital data α set at the α setting register 5 from the data stored in the SAR register 4, and inputs the digital data SAR−α to the input value control circuit 6. Then, the comparator 3 compares the analog voltage output from the D/A converter 2 and the voltage applied to the ANI 1 with each other, and stores the result in the SAR−α comparison result register 10.

Period t6:

In the A/D converter 100, the expected value determine circuit 11 determines whether or not the expected values are stored in the SAR+α comparison result register 9 and the SAR−α comparison result register 10. Specifically, the expected value determine circuit 11 determines whether or not the result "the voltage input to the ANI 1 is smaller than the analog voltage obtained by the D/A converter 2 by performing DA conversion to the digital data SAR+α" is stored in the SAR+α comparison result register 9. Further, the expected value determine circuit 11 determines whether or not the result "the voltage input to the ANI 1 is greater than the analog voltage obtained by the D/A converter 2 by performing DA conversion to the digital data SAR−α" is stored in the SAR−α comparison result register 10. When the expected result is not found, the A/D converter 100 determines that the AD conversion result stored in the SAR register 4 is incorrect, and the expected value determine circuit 11 outputs a failure detection signal.

For example, the A/D converter 100 has a counter for counting, after accepting an AD conversion trigger, a period in synchronization with the clocks of the A/D converter 100.

The counter value is set to zero in period t1; to 1 in period t2; to 2 to 5 in period t3; to 6 in period t4; to 7 in period t5; and to 8 in period t6. The input value control circuit 6 is structured to select data from one of the SAR register 4, the SAR+α generator circuit 7, and the SAR−α generator circuit 8 depending on the counter value, and to output the selected data to the D/A converter 2. Specifically, when the counter value is 2 to 5, since it corresponds to period t3, the input value control circuit 6 outputs the data retained by the SAR register 4 of the number of bits (four herein) of the successive approximation type of the A/D converter 100. Thereafter, when the counter value becomes 6, since it corresponds to period t4, the input value control circuit 6 outputs the data retained by the SAR+α generator circuit 7. Subsequently, when the counter value becomes 7, since it corresponds to period t5, the input value control circuit 6 outputs the data retained by the SAR−α generator circuit 8.

In addition, the SAR+α comparison result register 9 and the SAR−α comparison result register 10 are structured to properly retain the determination result output from the comparator 3 in period t4 or t5 depending on the counter value described above.

Further, the A/D converter 100 may be structured to control operations by counting the number of clocks from the start of AD conversion. For example, to the A/D converter 100, the number of clocks (the number of counts of the counter) required per AD conversion is set, and the control operation is determined in accordance with the number of counts. For example, the conversion trigger acceptance and the sampling are performed in the period from the 1st to 18th clocks. Subsequently, successive approximation is performed in the period from the 19th to 40th clocks.

Figure 4:
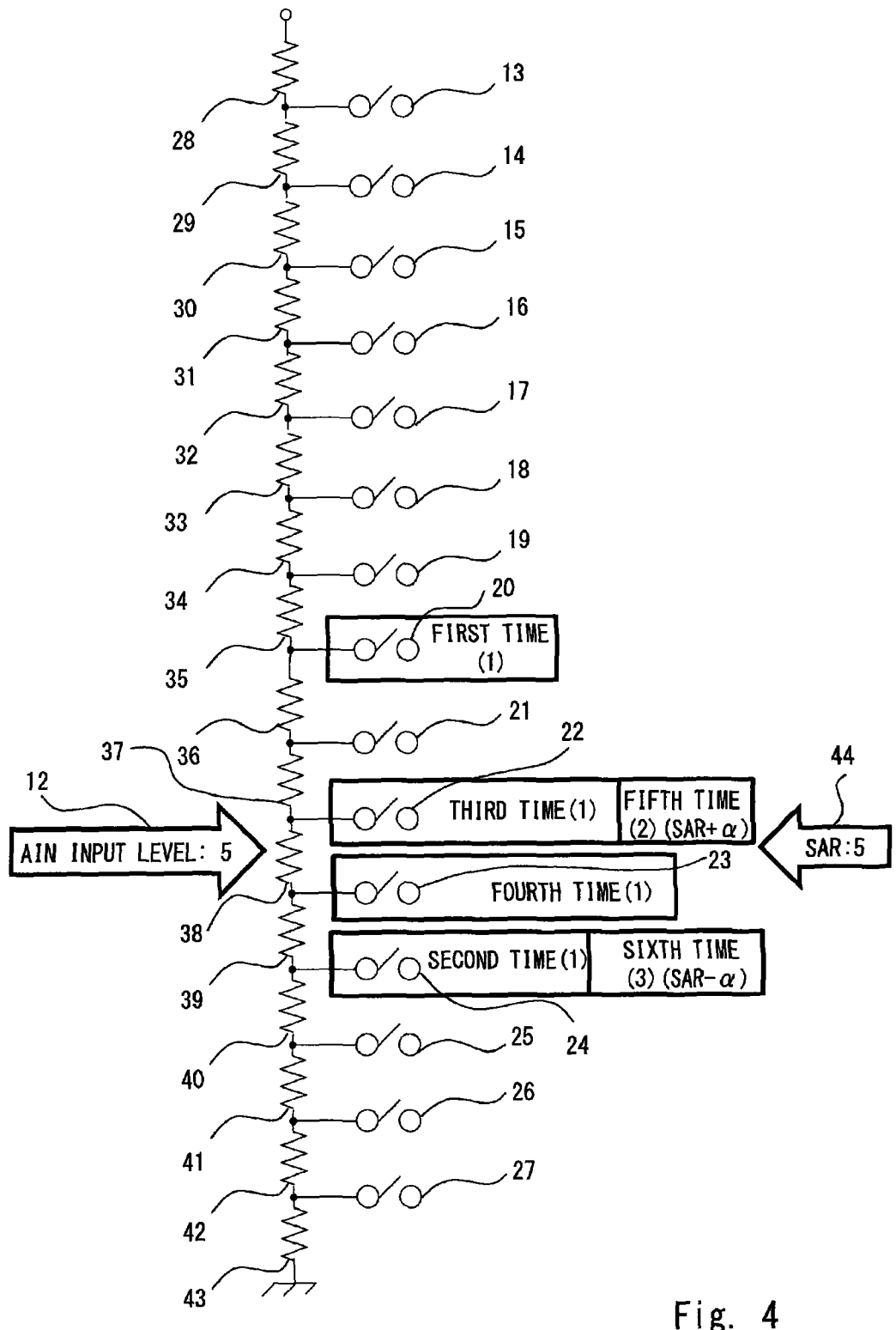
FIG. 4 shows an exemplary operation when the D/A converter is normal.
Figure 5:
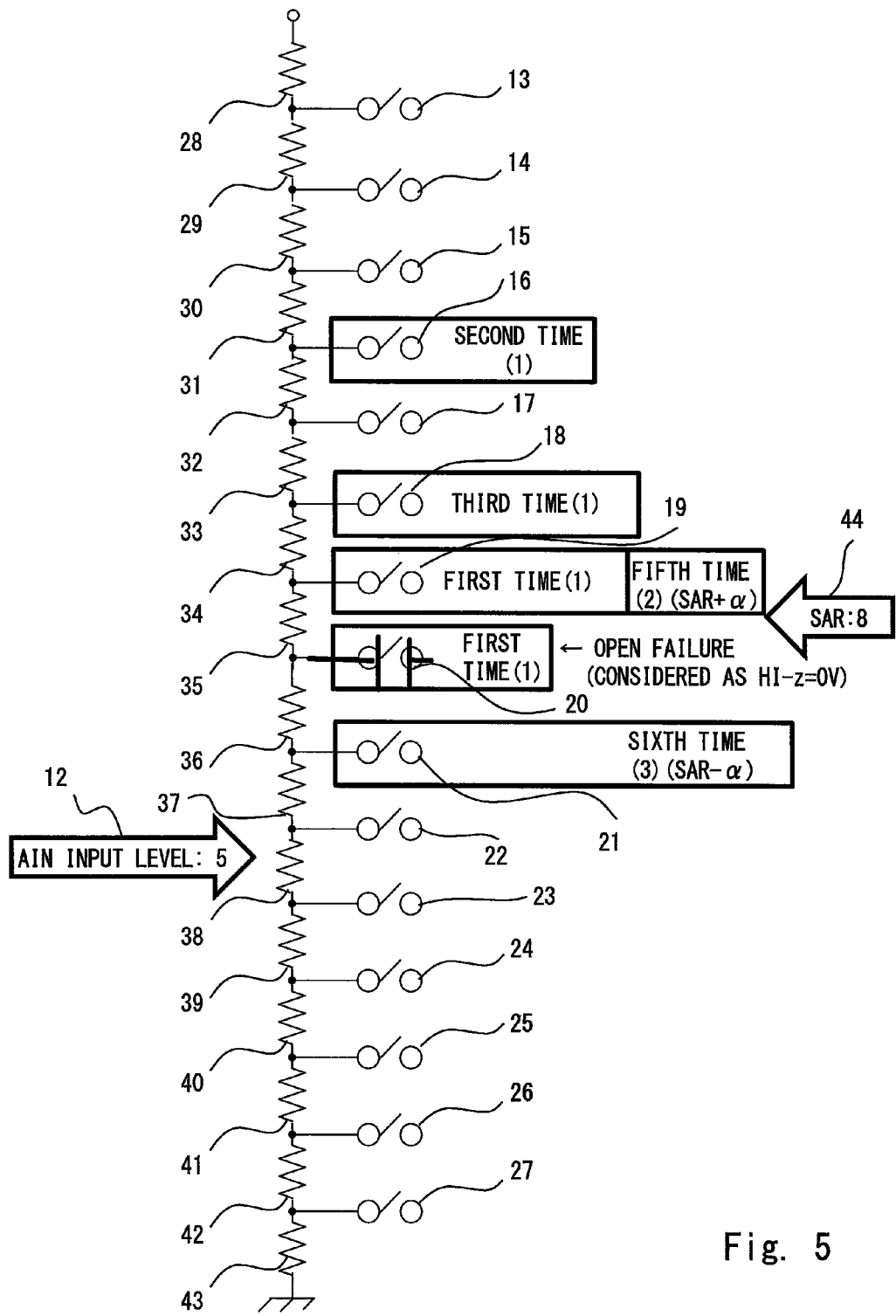
FIG. 5 shows an exemplary operation in the case where the D/A converter uses a SW with an OPEN failure.
Figure 6:
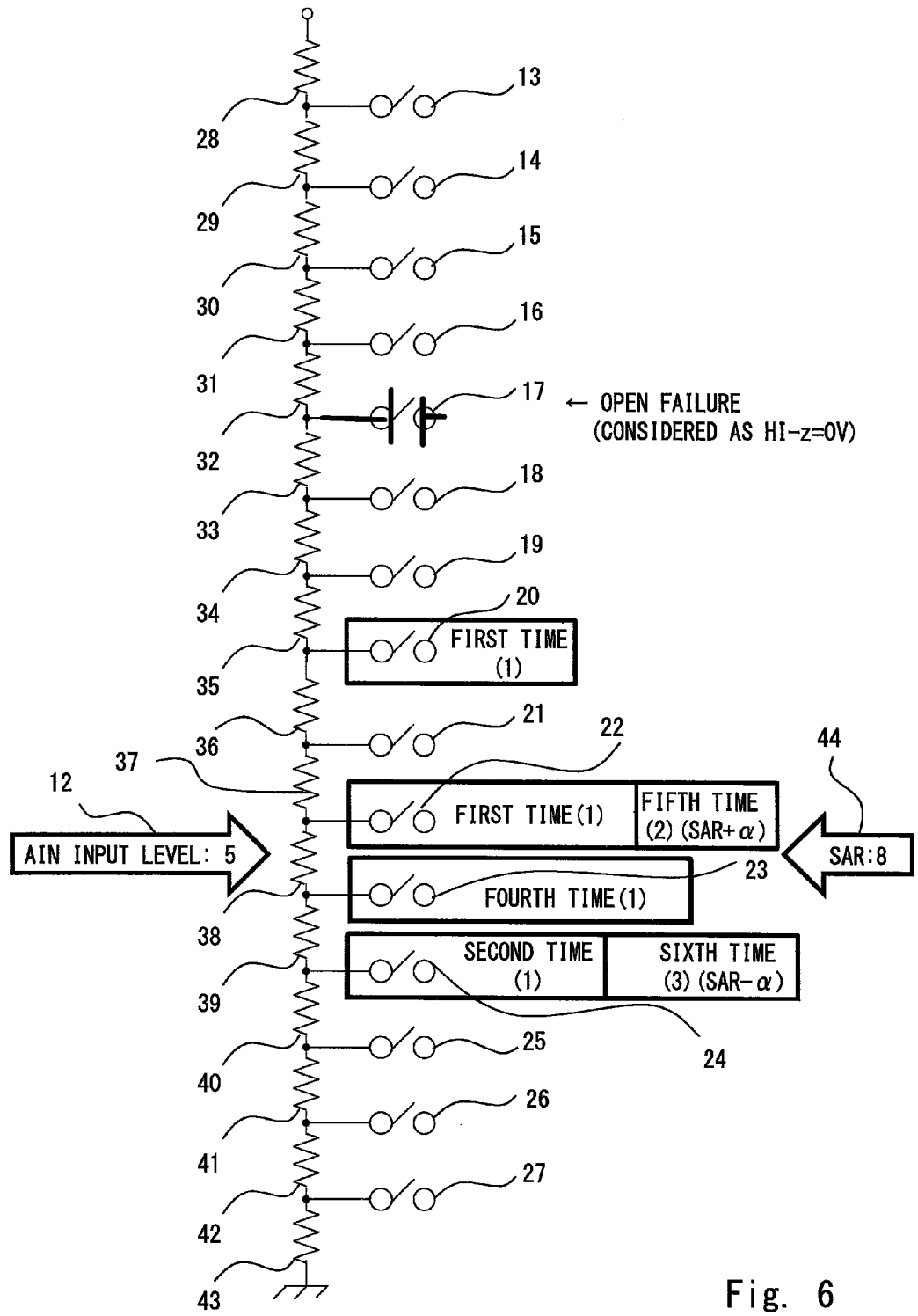
FIG. 6 shows an exemplary operation in the case where the D/A converter is suffering from an OPEN failure and the SW with the OPEN failure is not used.

FIGS. 4, 5, and 6 are each an operation explanatory diagram in which an exemplary operation is added to a circuit diagram showing ladder resistors and a switch (hereinafter abbreviated as SW) group built in the D/A converter 2.

The D/A converter 2 includes a resistor group (ladder resistor) including sixteen resistors 28 to 42 of equal resistance values for equally dividing the reference voltage by sixteen, and a group of switches SW 13 to 27 for setting the analog voltage output from the D/A converter 2 in accordance with the output of the input value control circuit 6.

The A/D converter 100 controls ON/OFF of the SW group included in the D/A converter 2 by the output data output from the input value control circuit 6. The input value control circuit 6 is structured to output, as the digital data output to the D/A converter 2, the digital data stored in the SAR register 4 in period t3, the digital data output from the SAR+α generator circuit 7 in period t4, and the digital data output from the SAR−α generator circuit 8 in period t5. In other words, the input value control circuit 6 controls the SW group based on the digital data output from any one of the SAR register 4, the SAR+α generator circuit 7, and the SAR−α generator circuit 8.

FIGS. 4 to 6 are premised on the followings for the sake of convenience of the description. The voltage level being applied to the ANI 1 is "5". The digital data α is "1" (α=1). In addition, when the comparator 3 shows that "the voltage being applied to the ANI 1 is "lower" than the voltage being output from the D/A converter 2", the SAR+α comparison result register 9 and the SAR−α comparison result register 10 store "0" (zero). On the other hand, when the comparator 3 shows that "the voltage being applied to the ANI 1 is "higher" than the voltage being output from the D/A converter 2", the SAR+α comparison result register 9 and the SAR−α comparison result register 10 store "1". The digital data α is "1" (α=1).

FIG. 4 shows an exemplary operation when the D/A converter 2 is normal.

While referring to FIG. 4, a description will be given of a normal operation, that is, when there is no failure in the DA converter 2, with reference to FIG. 3.

Period t1:
The A/D converter 100 accepts an AD conversion trigger.

Period t2:
The A/D converter 100 performs sampling of the analog voltage received from the ANI 1 in order to perform AD conversion of the successive approximation type.

Period t3:
The D/A converter 2 successively closes the SW 20, the SW 24, the SW 22, and the SW 23 upon the aforementioned comparisons performed four times, in accordance with the output data being output from the input value control circuit 6. In accordance with the operation of the D/A converter 2 closing each SW, the comparator 3 successively compares the input voltage 12 being applied to the ANI 1 with the analog output from the D/A converter 2, and the AD conversion result is stored in the SAR register 4. Here, the A/D converter 100 stores data "5" being the AD conversion result obtained by the AD conversion in the SAR register 4.

Period t4:
In order to output the voltage corresponding to the digital data SAR+α (specifically, 5+1=6) from the D/A converter 2, the input value control circuit 6 outputs the digital data SAR+α to the D/A converter 2. The D/A converter 2 closes the SW 22 and outputs the analog voltage corresponding to the digital data SAR+α. The comparator 3 compares the input voltage 12 being applied to the ANI 1 and the analog voltage being output from the D/A converter 2 with each other. The comparator 3 determines that "the input voltage 12 being applied to the ANI 1 is "lower" than the voltage being output from the D/A converter 2", and the determination result "0" is stored in the SAR+α comparison result register 9.

Period t5:
In order to output the voltage corresponding to the digital data SAR−α (specifically, 5−1=4) from the D/A converter 2, the input value control circuit 6 outputs the digital data SAR−α to the D/A converter 2. The D/A converter 2 closes the SW 24 and outputs the analog voltage corresponding to the digital data SAR−α. The comparator 3 compares the input voltage 12 being applied to the ANI 1 and the analog voltage being output from the D/A converter 2 with each other. The comparator 3 determines that "the input voltage 12 being applied to the ANI 1 is "higher" than the voltage being output from the D/A converter 2", and the determination result "1" is stored in the SAR−α comparison result register 10.

Period t6:
The expected value determine circuit 11 compares the values stored in the SAR+α comparison result register 9 and the SAR−α comparison result register 10 against the expected values (i.e., the SAR+α comparison result register 9 storing "0", and the SAR−α comparison result register 10 storing "1"). Since the comparison result shows an agreement with the expected values, the expected value determine circuit 11 reports that the AD conversion result stored in the SAR register 4 is normal by not outputting a failure detection signal.

Next, with reference to FIG. 5, a description will be given of the case where a SW with an OPEN failure exists in the D/A converter 2 and a failure is detected because of its incapability of normally performing. FIG. 5 shows an exemplary operation in the case where the D/A converter 2 uses a SW with an OPEN failure. Here, an exemplary operation in the case where the SW 20 is suffering from an OPEN failure is shown in the following. Note that, an OPEN failure refers to the failure of an SW of the ladder resistor failing to close.

Period t1:

The A/D converter 100 accepts an AD conversion trigger.

Period t2:

In order to perform the successive approximation AD conversion, the A/D converter 100 performs sampling of an analog voltage being input from the ANI 1.

Period t3:

The D/A converter 2 successively closes the SW 20, the SW 16, the SW 18, and the SW 19 upon comparisons performed four times, in accordance with the output data being output from the input value control circuit 6. In accordance with the operation of the D/A converter 2 closing each SW, the comparator 3 successively compares the input voltage 12 being applied to the ANI 1 with the analog output from the D/A converter 2, and the AD conversion result is stored in the SAR register 4 (i.e., a normal successive approximation AD conversion is performed). When the SW 20 is closed upon the first comparison, the SW 20 is suffering from an OPEN failure, and the comparator 3 compares the analog voltage of approximately 0 V and the input voltage 12 being applied to the ANI 1 with each other. Therefore, the input voltage 12 being applied to the ANI 1 is erroneously determined to be higher than the analog voltage that is output when the D/A converter 2 closes the SW 20. At the second time, the input value control circuit 6 inputs data for closing the SW 16 to the D/A converter 2. Thereafter, upon all the second, third and fourth comparisons, the input voltage 12 being applied to the ANI 1 is determined by the comparator 3 to be lower than the analog voltage output by the D/A converter 2. Here, the A/D converter 100 stores the data "8" of the AD conversion result obtained by this AD conversion in the SAR register 4.

Period t4:

In order to output the voltage corresponding to the digital data SAR+α (8+1=9) from the D/A converter 2, the input value control circuit 6 outputs the digital data SAR+α to the D/A converter 2. The D/A converter 2 closes the SW 19, and outputs an analog voltage corresponding to the digital data SAR+α. The comparator 3 compares the input voltage 12 being applied to the ANI 1 and the analog voltage being output from the D/A converter 2 with each other. The comparator 3 determines that "the input voltage 12 being applied to the ANI 1 is "lower" than the voltage being output from the D/A converter 2", and the determination result ("0") is stored in the SAR+α comparison result register 9.

Period t5:

In order to output the voltage corresponding to the digital data SAR−α (8−1=7) from the D/A converter 2, the input value control circuit 6 outputs the digital data SAR−α to the D/A converter 2. The D/A converter 2 closes the SW 21, and outputs an analog voltage corresponding to the digital data SAR−α. The comparator 3 compares the input voltage 12 being applied to the ANI 1 and the analog voltage being output from the D/A converter 2 with each other. The comparator 3 determines that "the input voltage 12 being applied to the ANI 1 is "lower" than the voltage being output from the D/A converter 2", and the determination result "0" is stored in the SAR−α comparison result register 10.

Period t6:

The expected value determine circuit 11 compares the values stored in the SAR+α comparison result register 9 and the SAR−α comparison result register 10 against the expected values (i.e., the SAR+α comparison result register 9 storing "0", and the SAR−α comparison result register 10 storing "1"). Since the comparison result shows a difference from the expected values, the expected value determine circuit 11 reports that the AD conversion result stored in the SAR register 4 is abnormal by outputting a failure detection signal.

Subsequently, with reference to FIG. 6, a description will be given of the case where, despite the presence of a SW suffering from an OPEN failure in the D/A converter 2, the operation is normally performed without any trouble. FIG. 6 shows an exemplary operation in the case where the D/A converter 2 is suffering from an OPEN failure and the SW with the OPEN failure is not used. Here, an exemplary operation in the case where the SW 17 is suffering from an OPEN failure is shown in the following.

Period t1:

The A/D converter 100 accepts an AD conversion trigger.

Period t2:

In order to perform the successive approximation AD conversion, the A/D converter 100 performs sampling of an analog voltage being input from the ANI 1.

Period t3:

The D/A converter 2 successively closes the SW 20, the SW 24, the SW 22, and the SW 23 upon comparisons performed four times, in accordance with the output data being output from the input value control circuit 6. The comparator 3 successively compares the input voltage 12 being applied to the ANI 1 with the analog output from the D/A converter 2, and the AD conversion result is stored in the SAR register 4. Here, the A/D converter 100 stores data "5", which is an AD conversion result being obtained by the AD conversion in the SAR register 4.

Period t4:

In order to output the voltage corresponding to the digital data SAR+α (5+1=6) from the D/A converter 2, the input value control circuit 6 outputs the digital data SAR+α to the D/A converter 2. The D/A converter 2 closes the SW 22, and outputs an analog voltage corresponding to the SAR+α. The comparator 3 compares the input voltage 12 being applied to the ANI 1 and the analog voltage being output from the D/A converter 2 with each other. The comparator 3 determines that "the input voltage 12 being applied to the ANI 1 is "lower" than the voltage being output from the D/A converter 2", and the determination result "0" is stored in the SAR+α comparison result register 9.

Period t5:

In order to output the voltage corresponding to the digital data SAR−α (5−1=4) from the D/A converter 2, the input value control circuit 6 outputs the digital data SAR−α to the D/A converter 2. The D/A converter 2 closes the SW 24, and outputs an analog voltage corresponding to the SAR−α. The comparator 3 compares the input voltage 12 being applied to the ANI 1 and the analog voltage being output from the D/A converter 2 with each other. The comparator 3 determines that "the input voltage 12 being applied to the ANI 1 is "higher" than the voltage being output from the D/A converter 2", and the determination result "1" is stored in the SAR−α comparison result register 10.

Period t6:

The expected value determine circuit 11 compares the values stored in the SAR+α comparison result register 9 and the SAR−α comparison result register 10 against the expected values (i.e., the SAR+α comparison result register 9 storing "0", and the SAR−α comparison result register 10 storing "1"). Since the comparison result shows an agreement with the expected values, the expected value determine circuit 11 reports that the AD conversion result stored in the SAR register 4 is normal by not outputting a failure detection signal. Here, since the SW 17 with an OPEN failure is not used in the AD conversion operation described above, the SAR register 4 stores the correct value. Hence, no abnormality is detected because the AD conversion result is correct.

Note that, in the present exemplary embodiment, while the description has been given of the example of a 4-bit A/D converter, the same holds true for an A/D converter of any number of bits.

Mechanism and Effect of First Exemplary Embodiment

In accordance with the present exemplary embodiment, the A/D converter 100 compares an analog input voltage against the voltage obtained by performing DA conversion to the digital data SAR+α, which is obtained by adding the digital data α in period t4 to the AD conversion result obtained in period t3, and stores the comparison result in the SAR+α comparison result register 9. In addition, the A/D converter 100 compares an analog input voltage against the voltage obtained by performing DA conversion to digital data SAR−α, which is obtained by subtracting the digital data α in period t5, and stores the comparison result in the SAR−α comparison result register 10. Then, the A/D converter 100 determines, in period t6, whether the values stored in the SAR+α comparison result register 9 and the SAR−α comparison result register 10 agree with the expected values. Such operations enable the diagnosis-target A/D converter itself to perform a failure diagnosis to the AD conversion result. In addition, since the failure diagnosis is performed with an addition of extra twice (2-bit) comparisons as compared to the normal successive approximation AD conversion, it is possible to constantly perform the failure diagnosis. That is, the effect of performing a constant failure diagnosis can be achieved, without the necessity of adding a failure diagnosis-dedicated D/A converter.

Here, with reference to the technique of Takamatu et al., a description will be given of the advantageous effect of the A/D converters 80 and 100 according to one exemplary embodiment, which is the constant failure diagnosis being enabled without the necessity of adding a failure diagnosis-dedicated D/A converter.

Figure 7:
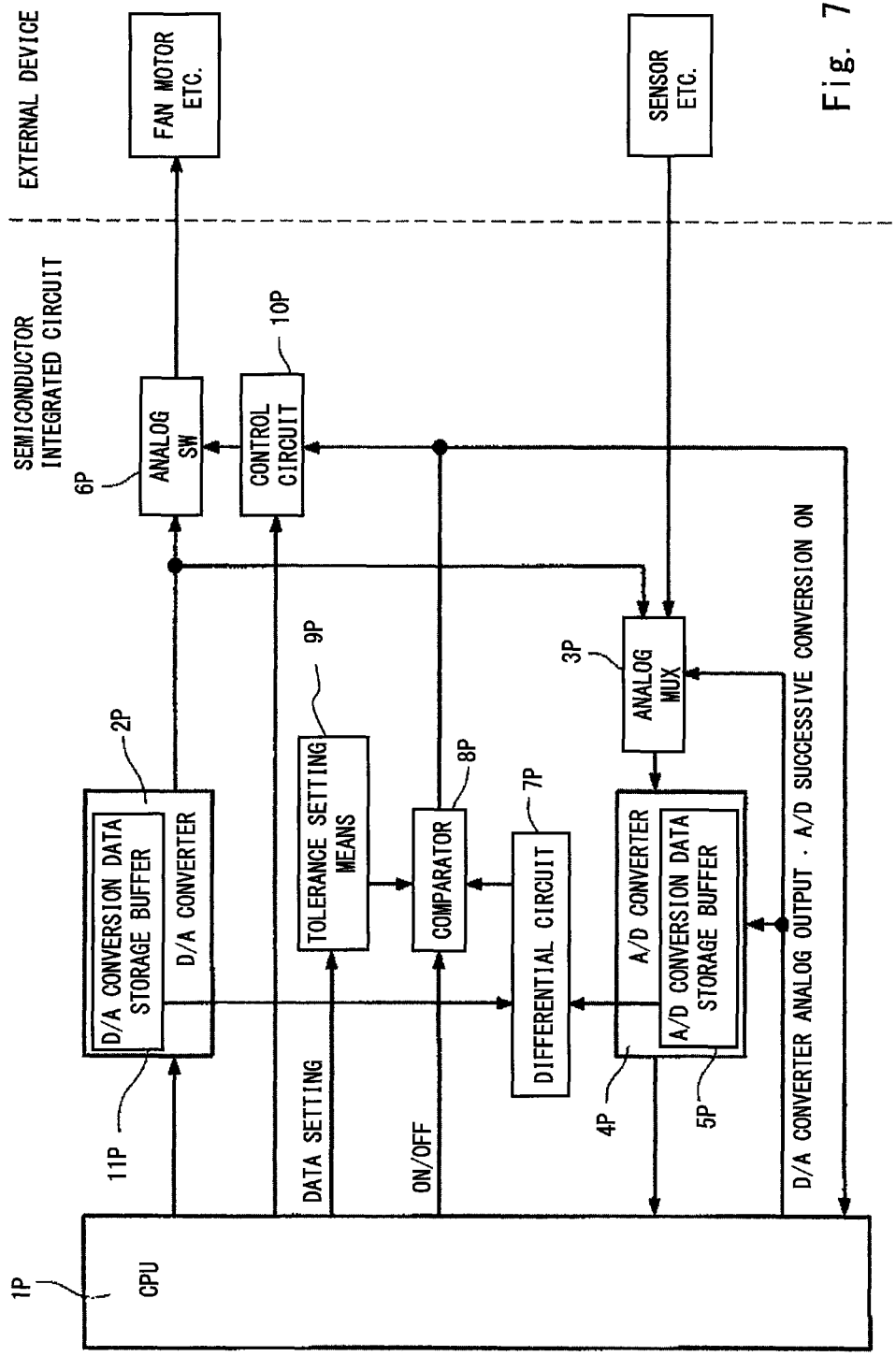
FIG. 7 is a block diagram showing the structure of a semiconductor integrated circuit in which the D/A converter failure diagnosis function disclosed in Takamatu et al. is installed.

FIG. 7 is a block diagram showing the structure of a semiconductor integrated circuit in which the D/A converter failure diagnosis function disclosed in Takamatu et al. is installed.

In FIG. 7, a CPU (Central Processing Unit) 1P sets, to a D/A conversion data storage buffer 11P, a digital value to be input to a D/A converter 2P such that a desired analog voltage is output to a motor. The CPU controls the motor by instructing DA conversion and thereafter instructing output of an analog voltage obtained by the DA conversion to the motor. On the other hand, what is included is an analog multiplexer 3P that the CPU 12 can switch, such that one of an input from a sensor or the like and an input from an analog voltage converted by the D/A converter 2P is output to an A/D converter 4P. In performing the failure diagnosis, the CPU 1P instructs the analog multiplexer 3P to input the analog voltage converted by the D/A converter 2P to the A/D converter 4P. The A/D converter 4P receiving the converted analog voltage successively performs AD conversion, and after the conversion is finished, the A/D converter 4P stores the converted digital value in an A/D conversion data storage buffer 5P. The successively created values of the A/D conversion data storage buffer 5P are input to a differential circuit 7P that can constantly output the difference from the values in the D/A conversion data storage buffer 11P.

Further, the output of the differential circuit 7P is input to the comparator 8P that constantly compares the tolerance previously set to tolerance setting means 9P and the output of the differential circuit 7P with each other, and that outputs the result of a determination as to whether or not the output of the differential circuit 7P falls within the tolerance range. By determining whether or not the difference between the input digital value stored in the D/A conversion data storage buffer 11P and the A/D converted digital value stored in the A/D conversion data storage buffer 5P falls within the tolerance range, it becomes possible to determine whether or not an abnormality is occurring in the converted analog voltage of the D/A converter 2P at this time point. However, the comparator 8P cannot output the comparison-determination result unless an output allowing instruction is provided from the CPU 1P. The output allowing instruction is given at the time point when the input of the analog multiplexer 3P is switched to the converted analog voltage of the D/A converter 2P. Further, the output from the comparator 8P is input to a control circuit 10P that switches ON/OFF of an analog SW 6P of the D/A converter 2P. When the result of comparison-determination of the comparator 8P is outside the tolerance range, the control circuit 10P turns OFF the analog SW 6P that controls the output of the D/A converter 2P. In this manner, since the failure diagnosis process of the D/A converter 2P can be constantly controlled, being independent of the processing timing of software, the failure diagnosis of the D/A converter 2P is performed more quickly and safely. Thus, the output of the D/A converter 2P to the motor is limited immediately and safely upon an occurrence of a failure.

In contrast to the technique of Takamatu et al., the A/D converters 80 and 100 according to one exemplary embodiment can perform the failure diagnosis as part of the AD conversion operation. Specifically, as shown in FIG. 2, after normal AD conversion is performed in periods t1 to t3, a failure diagnosis is performed in periods t4 to t6. In other words, thanks to such a performance manner, the failure diagnosis can be performed using the D/A converter 2 used for the normal AD conversion without the necessity of switching the circuit structure. Since the A/D converters 80 and 100 according to one exemplary embodiment have such a structure, the problems associated with the technique of Takamatu et al. can be solved.

Second Exemplary Embodiment

Figure 8:
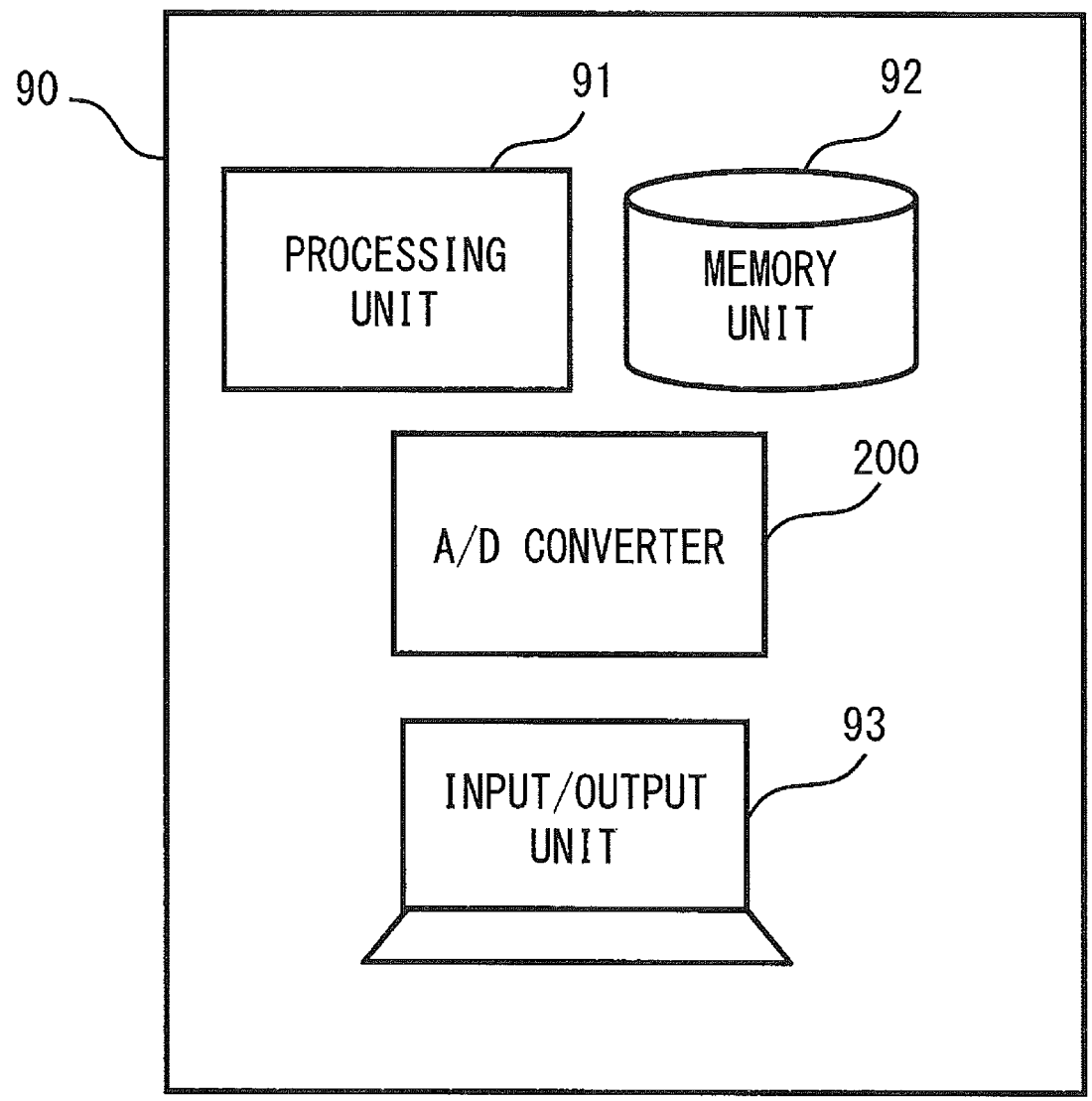
FIG. 8 is a block diagram schematically showing an exemplary structure in which an A/D converter according to the second exemplary embodiment is installed in a computer apparatus.

In the first exemplary embodiment, the description has been given of the exemplary structure in which the self-diagnosis system performed by the A/D converter 100 is realized by hardware. In the second exemplary embodiment, a description will be given of an exemplary structure realized by a combination of hardware and software. FIG. 8 is a block diagram schematically showing an exemplary structure in which an A/D converter 200 according to the second exemplary embodiment is installed in a computer apparatus 90. FIG. 8 shows an exemplary structure in which the computer apparatus 90 is structured by a processing unit 91 structured by a CPU, a memory unit 92, and an input/output unit 93, and in which the A/D converter 200 is further installed. For the sake of convenience of the description, in FIG. 8, of the elements of the self-diagnosis system of the A/D converter 200, the program realized by software is also shown as the A/D converter 200. However, the program is stored in the storage area such as a hard disk and a ROM. When the program is executed, the program is read to the RAM, and a command group structuring the program is executed under control of the CPU. Therefore, the program is only required to be stored in any storage area from which the processing unit 91 can read, and is stored in the memory unit 92, for example. FIG. 8 is not intended to show that it is essential to include a storage area for storing a program in the A/D converter 200.

The processing unit 91 reads a program that realizes part of the self-diagnosis system stored in the memory unit 92 and executes the program, to thereby realize the functions of the computer apparatus 90.

The memory unit 92 is a storage medium (storage area) that stores information, and is structured by a storage apparatus such as a hard disk, RAM (Random Access Memory), and ROM (Read Only Memory).

The input/output unit 93 is an input/output interface for the user of the computer apparatus 90, and is structured by, for example, a keyboard, a mouse, and an LCD.

The computer apparatus 90 is, for example, a common general purpose computer such as a personal computer. The computer apparatus 90 acquires a program or data for realizing the self-diagnosis system of the A/D converter 200 according to the present exemplary embodiment, and records the program or data on the memory unit 92. The program or data can be written to the memory unit 92 via the input/output unit 93 of the computer apparatus 90. Alternatively, the computer apparatus 90 can acquire an execution program or data from an external source via a network.

Based on the structure described above, the computer apparatus 90 reads the acquired program and executes the same under control of the CPU.

FIG. 9 is a block diagram showing an exemplary structure of the self-diagnosis system of the A/D converter 200 according to the second exemplary embodiment. The A/D converter 200 includes an analog input terminal 1, a D/A converter 2, a comparator 3, an SAR register 4, an $\alpha$ retaining unit 205, an SAR+$\alpha$ register (SAR+$\alpha$) 207, an SAR−$\alpha$ register (SAR−$\alpha$) 208, a data generator unit 212, an SAR+$\alpha$ comparison result register 9, an SAR−$\alpha$ comparison result register 10, and an expected value determination unit 211. In addition, FIG. 9 shows a processing unit 91 and a memory unit 92, in addition to the A/D converter 200.

FIG. 9 shows the case where the $\alpha$ retaining unit 205, the data generator unit 212, the SAR+$\alpha$ comparison result register 9, the SAR−$\alpha$ comparison result register 10, and the expected value determination unit 211 are realized by a program. FIG. 9 shows that the processing unit 91 reads a command group of the program realizing these functions from the memory unit 92 and executing the command group.

Further, the A/D converter 200 is associated with the constituent elements of the A/D converter 80 shown in FIG. 1 as follows. The $\alpha$ retaining unit 205, the SAR+$\alpha$ register (SAR+$\alpha$) 207, the SAR−$\alpha$ register (SAR−$\alpha$) 208, and the data generator unit 212 structure the generator unit 285, which corresponds to the generator unit 85. Further, the SAR+$\alpha$ comparison result register 9, the SAR−$\alpha$ comparison result register 10, and the expected value determination unit 211 correspond to the determination unit 86.

The constituent elements denoted similarly to those in FIG. 2 are similar and therefore the description thereof will not be repeated. Here, a description will be given of a register or retaining unit that retains data, and the processes of the data generator unit 212 and the expected value determination unit 211 that are realized by a program.

The $\alpha$ retaining unit 205 retains digital data $\alpha$.

The SAR+$\alpha$ register 207 outputs digital data SAR+$\alpha$ to the input value control circuit 6.

The SAR−$\alpha$ register 208 outputs digital data SAR−$\alpha$ to the input value control circuit 6.

The data generator unit 212 stores the digital data SAR+$\alpha$, which is obtained by adding the digital data $\alpha$ to the data stored in the SAR register 4, in the SAR+$\alpha$ register 207, and stores the digital data SAR−$\alpha$, which is obtained by subtracting the digital data $\alpha$ from the data stored in the SAR register 4, in the SAR−$\alpha$ register 208. In other words, the data generator unit 212 is a program that causes the processing unit 91 (the computer apparatus 90) to execute the process of storing the digital data SAR+$\alpha$ in the SAR+$\alpha$ register 207, and the process of storing the digital data SAR−$\alpha$ in the SAR−$\alpha$ register 208.

When the digital data $\alpha$ is a fixed value, the $\alpha$ retaining unit 205 retains a preset numerical value. On the other hand, when the digital data $\alpha$ is externally set, the data generator unit 212 receives the digital data $\alpha$ and then stores the digital data $\alpha$ in the $\alpha$ retaining unit 205.

The expected value determination unit 211 can refer to the counter value described in connection with the first exemplary embodiment. The expected value determination unit 211 determines, in period t6, whether or not the SAR+$\alpha$ comparison result and the SAR−$\alpha$ comparison result are expected values. Since the determination method is similar to that in the first exemplary embodiment, the description thereof will not be repeated. In other words, the expected value determination unit 211 is a program that causes the processing unit 91 to execute the process of determining, in period t6, whether or not the SAR+$\alpha$ comparison result and the SAR−$\alpha$ comparison result are expected values. Note that, it is not intended to exclude the mode of realizing the SAR+$\alpha$ comparison result register 9 and the SAR−$\alpha$ comparison result register 10 with the storage area. For example, the expected value determination unit 211 may have a storage area for retaining the SAR+$\alpha$ comparison result and the SAR−$\alpha$ comparison result, and may perform the process of storing the SAR+$\alpha$ comparison result in the storage area in period t4, and the process of storing the SAR−$\alpha$ comparison result in the storage area in period t5.

The A/D converter 200 according to the present exemplary embodiment performs the operations from the conversion trigger acceptance to the expected value determination shown in FIG. 3. Details of the operations are similar to those in the first exemplary embodiment, and therefore are not repeated herein. In addition, the A/D converter 200 according to the second exemplary embodiment can achieve the effect similar to the A/D converter 100 according to the first exemplary embodiment.

In the above example, the program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

Third Exemplary Embodiment

The foregoing first and second exemplary embodiments show the exemplary structure in which the SAR register 4 stores the value output from the comparator 3, and is structured as a read-only register for other constituent elements.

However, it is also possible to structure the SAR register 4 to be capable of being written by other constituent elements. For example, in FIG. 2, after the SAR+α generator circuit 7 finishes the fourth comparison in period t3, the SAR+α generator circuit 7 may write the digital data SAR+α to the SAR register 4 at the start of period t4; the SAR−α generator circuit 8 may write the digital data SAR−α to the SAR register 4 at the start of period t5. The input value control circuit 6 receives data only from the SAR register 4. Thus, the registers included in the SAR+α generator circuit 7 and the SAR−α generator circuit 8 for retaining digital data can be eliminated. Similarly, in FIG. 9, after the data generator unit 212 finishes the fourth comparison in period t3, the data generator unit 212 may write the digital data SAR+α to the SAR register 4 at the start of period t4; and may write the digital data SAR−α to the SAR register 4 at the start of period t5. Thus, the SAR+α register 207 and the SAR−α register 208 can be eliminated from the A/D converter 200.

Without being limited to the modifications described above, the registers are versatile. By devising the elements and timing associated with the writing operation of the registers, the registers included in the A/D converter can be reduced.

In the foregoing, while the invention made by the inventors has been specifically described based on the exemplary embodiments, it goes without saying that the present invention is not limited to the foregoing exemplary embodiments, and can be modified in various manners within a range not departing from the gist of the present invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above. Each of the embodiments can be combined as desirable by one of ordinary skill in the art.

Furthermore, it is noted that, Applicant's intent is to encompass equivalents of all claim elements, even if amended later during prosecution.

What is claimed is:

1. An analog-to-digital converter comprising:
   an input terminal to which an analog input voltage is input;
   a digital-to-analog converter unit;
   a comparator that compares the analog input voltage and an output voltage of the digital-to-analog converter unit with each other;
   a successive approximation register that stores a conversion result output from the comparator;
   a generator unit that generates added digital data and subtracted digital data, the added digital data and the subtracted digital data being obtained by adding and subtracting the conversion result to and from the conversion result retained by the successive approximation register, respectively; and
   a determination unit that determines whether or not a failure is occurring, by using a result of the comparison between the analog input voltage and output levels obtained by the digital-to-analog converter unit converting the added digital data and the subtracted digital data.

2. The analog-to-digital converter according to claim 1, wherein the determination unit determines that a failure is absent when the analog input voltage is lower than a first output level obtained by the conversion of the added digital data and greater than a second output level obtained by the conversion of the subtracted digital data, the determination unit determining that a failure is present in other conditions.

3. The analog-to-digital converter according to claim 2, wherein
   the digital-to-analog converter unit outputs the first output level and the second output level obtained by the conversion of the added digital data and the subtracted digital data to the comparator,
   the comparator outputs, to the determination unit, a first comparison result obtained by a comparison between the analog input voltage and the first output level, and a second comparison result obtained by a comparison between the analog input voltage and the second output level, and
   the determination unit determines whether a failure is present or absent based on the first comparison result and the second comparison result.

4. The analog-to-digital converter according to claim 1, further comprising a setting unit that stores the prescribed value.

5. The analog-to-digital converter according to claim 1, wherein the prescribed value is a digital value equal to or greater than an overall error of the analog-to-digital converter.

6. The analog-to-digital converter according to claim 5, wherein the overall error is a value that changes depending on a usage environment of the user, the value changing in accordance with at least one of the number of bits subjected to analog-to-digital conversion, a supplied voltage, and whether or not an optional function of the analog-to-digital conversion is used.

7. The analog-to-digital converter according to claim 1, wherein, in converting analog data into digital data, the comparator further performs the comparison twice in addition to the number of bits to be converted.

8. The analog-to-digital converter according to claim 1, wherein the comparator repeats the comparison by the number of bits to be converted, and thereafter compares the analog input voltage and the output levels obtained by the conversion of the added digital data and the subtracted digital data with each other.

9. The analog-to-digital converter according to claim 1, wherein the digital-to-analog converter unit further comprising:
   a digital-to-analog converter; and
   an input value control circuit that outputs, to the digital-to-analog converter, one of the conversion result retained by the successive approximation register, the added digital data, and the subtracted digital data.

10. The analog-to-digital converter according to claim 9, wherein the input value control circuit is structured to output the conversion result as many as the number of bits to be converted, and thereafter to output the added digital data and the subtracted digital data in turn.

11. The analog-to-digital converter according to claim 1, wherein the determination unit determines whether or not a failure is occurring every time the analog input voltage is converted into digital data.

12. A self-diagnosis method for an analog-to-digital converter having at least a comparator and a digital-to-analog converter, the method comprising:
   converting, by the analog-to-digital converter, an analog input voltage into digital data;
   generating added digital data by adding a prescribed value to the converted digital data and subtracted digital data by subtracting the prescribed value from the converted digital data;
   comparing, by the comparator, the analog input voltage and output levels with each other, the output levels being obtained by the digital-to-analog converter converting the added digital data and the subtracted digital data into analog data; and determining whether or not a failure is occurring using a result of the comparison.

13. The self-diagnosis method for an analog-to-digital converter according to claim 12, wherein, in making the determination as to whether or not a failure is occurring, it is determined that a failure is absent when the analog input voltage is lower than a first output level obtained by the conversion of the added digital data and greater than a second output level obtained by the conversion of the subtracted digital data, and that a failure is present in other conditions.

14. The self-diagnosis method for an analog-to-digital converter according to claim 12, wherein the digital-to-analog converter unit controls, as a result of the conversion, timing of outputting one of the added digital data and the subtracted digital data.

* * * * *